United States Patent [19]
Azadet et al.

[11] Patent Number: 5,625,304
[45] Date of Patent: Apr. 29, 1997

[54] VOLTAGE COMPARATOR REQUIRING NO COMPENSATING OFFSET VOLTAGE

[75] Inventors: Kameran Azadet, Middletown; Alexander G. Dickinson, Neptune; David A. Inglis, Holmdel, all of N.J.

[73] Assignee: Lucent Technologies Inc., Murray Hill, N.J.

[21] Appl. No.: 426,510

[22] Filed: Apr. 21, 1995

[51] Int. Cl.$^6$ .............................. H03K 5/22; G11C 27/02
[52] U.S. Cl. ........................... 327/63; 327/77; 327/94
[58] Field of Search ................. 327/63–89, 91–96, 327/103, 337, 307

[56] References Cited

U.S. PATENT DOCUMENTS

| | | | |
|---|---|---|---|
| 4,598,215 | 7/1986 | Schechtman et al. | 307/355 |
| 4,710,724 | 12/1987 | Connell et al. | 327/89 |
| 4,748,418 | 5/1988 | Kerth | 327/89 |
| 4,845,383 | 7/1989 | Iida | 307/355 |
| 4,868,417 | 9/1989 | Jandu | 307/355 |
| 4,899,068 | 2/1990 | Klose et al. | 327/89 |
| 5,028,815 | 7/1991 | Van De Plassche | 327/65 |
| 5,162,671 | 11/1992 | Ishihara | 307/362 |
| 5,247,210 | 9/1993 | Swanson | 307/355 |

OTHER PUBLICATIONS

"Dynamic Analog Techniques", E.A. Vittoz, *Design of MOS VLSI Circuits For Telecommunications*, Chapter 5, edited by Y. P. Tsividis and P. Antognetti, Prentice Hall, 1985.

*Primary Examiner*—Toan Tran

[57] ABSTRACT

A method and apparatus is provided for comparing a first input voltage to a second input voltage. In one embodiment of the invention, a first input voltage is transformed into a first current flowing through a first transistor and a second transistor. A second input voltage is transformed into a second current flowing through the first transistor while the first current continues flowing through the second transistor. A difference current is developed which represents the difference between the first current and the second current. An indicator signal is generated which indicates the larger of the first and second input voltages based on the value of the difference current.

31 Claims, 2 Drawing Sheets

VOLTAGE COMPARATOR REQUIRING NO COMPENSATING OFFSET VOLTAGE

TECHNICAL FIELD OF THE INVENTION

The present invention relates generally to voltage comparators and more particularly to a voltage comparator that does not require a compensating offset voltage.

BACKGROUND OF THE INVENTION

Known analog voltage comparators are often constructed using a differential pair of transistors in which the voltages to be compared are each supplied to a different input transistor. One limitation of this configuration is that there is an inherent offset error due to the unavoidable deviation in the characteristics of different transistors (i.e., transistor mismatch). This offset error often amounts to about 10 mV, which is too large for many applications. For example, if one volt represents 8 bits of data yielding 256 distinct states, only about 4 mV separates adjacent states. Clearly an error greater than 4 mV is often intolerable.

Comparators are known which compensate for the offset error by providing a compensating voltage, but these comparators require additional circuitry and hence are unduly complex. Examples of such comparators are shown in E. A. Vittoz, "Dynamic Analog Techniques," VLSI Circuits for Telecommunications, edited by Y. P. Tsividis and P. Antognetti, Prentice Hall, 1995.

SUMMARY OF THE INVENTION

The present invention provides a method and apparatus for comparing a first input voltage to a second input voltage. The invention overcomes the problem of transistor mismatch without the need for a compensating offset voltage and thus without the need for additional circuitry. The invention achieves this result by applying the first and second input voltages to the same input transistor rather than to two different transistors. As a result, the two voltages undergoing comparison experience the same environment and consequently the problem of transistor mismatch does not arise.

In accordance with the method of the invention, a first input voltage is transformed into a first current flowing through a first transistor and a second transistor. A second input voltage is transformed into a second current flowing through the first transistor while the first current continues flowing through the second transistor. A difference current is developed which represents the difference between the first current and the second current. An indicator signal is generated which indicates the larger of the first and second input voltages based on the value of the difference current.

In one particular embodiment of the invention, the apparatus includes a first transistor of a first polarity. The first transistor has a drain-source path, a gate for selectively receiving the first and second input voltages, and a first source terminal for receiving a first supply voltage. A switching element is provided for selectively applying the first and second input voltages to the gate of the first transistor. A second transistor of a polarity opposite to the first polarity is also provided. The second transistor has a drain-source path serially coupled to the drain-source path of the first transistor and a second source terminal for receiving a second supply voltage. An output terminal is coupled to the drains of the first and second transistors. A switch is provided for selectively coupling the gate of the second transistor to the output terminal.

In one alternative embodiment of the invention, the first input voltage, offset by an offset voltage, is stored as a stored voltage. A differential voltage is developed between the second input voltage, also offset by the offset voltage, and the stored voltage. An output signal proportional to the differential voltage is generated. The output signal indicates the larger of the first and second input voltages. In one embodiment of the invention, these steps are performed with an apparatus that includes an operational amplifier having an inverting input, a non-inverting input, and an output. A switching element selectively applies the first and second input voltages to the noninverting input of the operational amplifier. A capacitor has a first terminal coupled to the inverting input of the operational amplifier and a second terminal for receiving a supply voltage. A switch selectively couples the output of the operational amplifier to the inverting input of the operational amplifier.

In another alternative embodiment of the invention, the first input voltage, offset by an offset voltage, is stored as a stored voltage. The second input voltage is also offset by the offset voltage to form an offsetting second voltage. An output signal is generated which represents a difference between the stored voltage and the offsetting second voltage. The output signal indicates the larger of the first and second input voltages.

DETAILED DESCRIPTION

Figure 1:
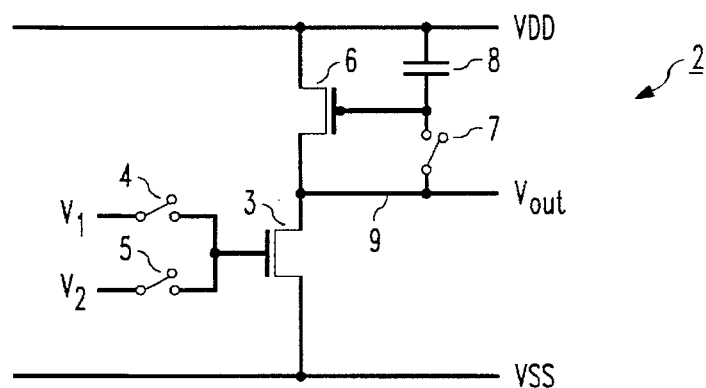
FIG. 1 shows a voltage comparator constructed in accordance with the present invention.

FIG. 1 shows an exemplary voltage comparator 2 constructed in accordance with one embodiment of the present invention. The input voltages $V_1$ and $V_2$ that are to be compared are selectively coupled to the gate of a first MOS transistor 3 via switches 4 and 5, respectively. That is, the input voltages $V_1$ and $V_2$ may be sequentially directed to the gate of the first transistor 3 by alternately closing and opening the switches 4 and 5. The first MOS transistor 3 has its source terminal connected to a first voltage supply $V_{SS}$ that is, for example, at ground potential. The drain of the first transistor 3 is coupled to the drain of a second MOS transistor 6. The source of the second MOS transistor 6 is connected to a second voltage supply $V_{DD}$ that is maintained at a higher potential than the first voltage supply $V_{SS}$. The output terminal 9 of the voltage comparator 2 is connected to a node located intermediate to the drains of the first and second transistors 3 and 6. The gate of the second MOS transistor 6 is selectively coupled to the output terminal 9 via a switch 7. As one of ordinary skill in the an will recognize, when switch 7 is closed, the second MOS transistor is in a diode mounted configuration. The gate of the second MOS transistor 6 also may be optionally connected to a capacitor 8 that is in turn connected to a constant reference voltage such as the second voltage supply $V_{DD}$, for example. The capacitor 8 may be advantageously employed when the parasitic or inherent gate-source capacitance of the second MOS transistor 6 is insufficient to maintain the voltage at the gate of the second transistor 6. The capacitor 8 may be a charge storage device such as a conventional capacitor or a MOS transistor in which the capacitance arises between the gate and transistor substrate.

The first and second MOS transistors 3 and 6 should have opposite polarities. Thus, in the exemplary embodiment of the invention shown in FIG. 1, the first MOS transistor 3 is an n-MOS transistor and the second MOS transistor 6 is a p-MOS transistor. Alternatively, the first MOS transistor 3 may be a p-MOS transistor and the second MOS transistor 6 may be an n-MOS transistor. In this latter case the first voltage supply $V_{SS}$ should be at a higher potential than the second voltage supply $V_{DD}$.

In operation, the switches 4, 5, and 7 are initially in their open state. Switches 4 and 7 are then closed, applying the first input voltage $V_1$ to the gate of the first transistor 3. In a MOS transistor, the drain-source current $I_{ds}$ depends on the applied gate-source voltage $V_{gs}$. Thus, the input voltage $V_1$ is in effect transformed into a current $I_{ds}(V_1)$ that flows through the source-drain path of the first transistor 3. Since the first and second transistors 3 and 6 are serially connected, the current $I_{ds}(V_1)$ flowing through the first transistor 3 also flows through the second transistor 6. The current $I_{ds}(V_1)$ flowing through the second transistor 6 causes a voltage $V_{gs}$ to appear between the gate and source of the second transistor 6 since the second transistor 6 is diode mounted when switch 7 is closed. This voltage is maintained or stored in the second transistor 6 by the parasitic gate-source capacitance of the transistor, and possibly by the capacitor 8 as well, if employed. Switch 7 may now be opened and the current $I_{ds}(V_1)$ flowing through the second transistor 6 will be maintained by the stored voltage.

In the next operational step, switch 4 is opened and switch 5 is closed so that the second input voltage $V_2$ is applied to the gate of the first transistor 3. Similar to the step previously described in which the first input voltage $V_1$ was transformed into a current flowing through the first transistor 3, the second input voltage $V_2$ now gives rise to a current $I_{ds}(V_2)$ flowing through the first transistor 3. Thus, a current $I_{ds}(V_1)$ now flows through the second transistor 6 while a current $I_{ds}(V_2)$ flows through the first transistor 3. If the currents $I_{ds}(V_1)$ and $I_{ds}(V_2)$ are not identical, a difference current will be generated at the output terminal 9 of the comparator 2. The difference current will bring the unloaded output of the comparator 2 into saturation. That is, the comparator output terminal 9 will provide a voltage equal to one of the supply voltages $V_{SS}$ or $V_{DD}$ when the currents $I_{ds}(V_1)$ and $I_{ds}(V_2)$ are unequal. More particularly, if the current $I_{ds}(V_1)$ is greater than the current $I_{ds}(V_2)$ the comparator output terminal 9 will be at a voltage $V_{DD}$. If the current $I_{ds}(V_1)$ is less than the current $I_{ds}(V_2)$, the comparator output terminal 9 will be at a voltage $V_{SS}$. Thus, the voltage appearing at the comparator output terminal 9 indicates whether the first input voltage $V_1$ is greater or less than the second input voltage $V_2$.

In summary, the comparator undergoes two distinct periods during its operation. In a first period denoted a transfer period, the first input voltage is applied to the comparator, transferred to the second transistor 6 and stored in a capacitor. In a subsequent period denoted a compare period, the second input voltage is applied to the comparator and the comparator generates an output voltage indicating the larger of the first and second input voltages.

The comparator 2 may be operated in a variety of modes. In one mode an input voltage, say the first input voltage $V_1$, has a constant value over time. In this mode the second input voltage may be continuously applied to the comparator by leaving switch 5 in its closed state after the constant input voltage $V_1$ has been transferred to the second transistor 6 by first closing and then reopening switches 4 and 7. In this manner the comparator remains in its compare period so that the second input voltage $V_2$ is continuously compared to the constant input voltage $V_1$.

In a second mode of operation the input voltages are variable. In this mode the switches 4 and 7, operated in unison, must be alternately opened and closed with switch 5 each time a comparison is to be performed so that the comparator 2 alternates between its transfer and compare periods. As a result, new values of the input voltages $V_1$ and $V_2$ will be input and compared after the completion of each compare period. The first mode of operation is advantageously employed whenever only one of the input voltages is variable because the dynamic power requirements are less in this mode of operation and because continual switching generates noise.

Figure 2:
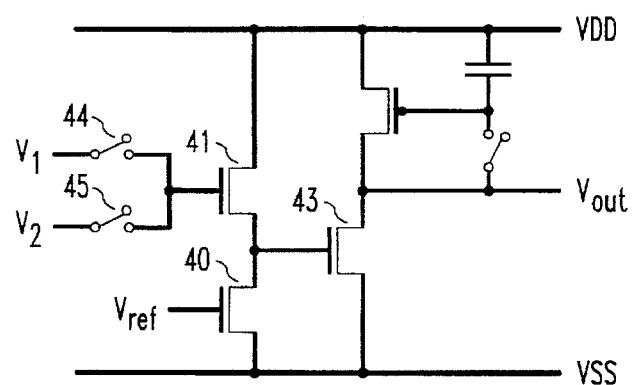
FIG. 2 shows an alternative embodiment of the voltage comparator which employs a source follower to provide immunization from noise.

FIG. 2 shows an alternative embodiment of the invention similar to that shown in FIG. 1 except that a source follower comprising serially connected transistors 40 and 41 is inserted between the gate of the first transistor 43 and the switches 44 and 45. The source follower is used to reduce noise from the first voltage supply $V_{SS}$, which may occur whenever current is injected into a supply rail with non-zero resistivity. This noise reduction is achieved by applying to the gate of transistor 40 a reference voltage $V_{ref}$ that is immune to noise. The reference voltage $V_{ref}$ may be more readily immunized from noise than the voltage supply $V_{SS}$ because, unlike $V_{SS}$, the reference voltage $V_{ref}$ only supplies a voltage and does not draw current.

As seen in FIG. 2, the source of transistor 40 is connected to the first supply voltage $V_{SS}$ and the drain of the transistor 41 is connected to the second supply voltage $V_{DD}$. The drain of the transistor 40 is connected to the source of transistor 41. A reference voltage is supplied to the gate of the transistor 40 and the input voltages $V_1$ and $V_2$ undergoing comparison are selectively input to the gate of the transistor 41 via switches 44 and 45, respectively. The transistors 40 and 41 should be of the same dimensions so that they have the same operational characteristics. The gate of the first transistor 43 is connected to a node located between the drain of transistor 40 and the source of transistor 41.

The following discussion will explain how the comparator shown in FIG. 2 is immunized from noise by the source follower. The voltage at the gate of the first transistor 43 is equal to $V_{in}-(V_{ref}-V_{SS})$, where $V_{in}$ is equal to either $V_1$ or $V_2$, depending on whether switch 44 or switch 45 is closed. The voltage at the source of the first transistor 43 is equal to $V_{SS}$. Accordingly, the voltage $V_{gs43}$ between the gate and source of the first transistor 43 is equal to $V_{in}-V_{ref}$ and thus the input voltage to the first transistor 43 is independent of the supply voltage $V_{SS}$.

The reference voltage should be selected so that it is equal to or greater than the threshold voltage of the transistor 40 so that the transistor 40 remains on. However, as explained below, when the reference voltage increases the range of voltages that may be compared by the comparator decreases. Therefore, a reference voltage should be selected that is not much larger than the threshold voltage to maximize the input dynamic range (i.e., the lower bound of the voltage $V_{in}$) of the comparator. The analysis presented below will explain why the input dynamic range decreases as the reference voltage increases.

An examination of FIG. 2 leads to the following equality:

$$V_{in}-V_{SS}=V_{GS41}+V_{GS43} \qquad (1)$$

where $V_{GS41}$ and $V_{GS43}$ are the gate-source voltages of transistors 41 and 43, respectively, and the remaining voltages have been previously defined. The gate-source voltage of transistor 43 must be larger than the threshold voltage so that the transistor does not turn off. That is, $$V_{GS43}>V_{th} \qquad (2)$$

Equation (1) thus becomes $$V_{in}-V_{SS}>V_{GS41}+V_{th} \qquad (3)$$

The gate source voltage of transistor 40 is $$V_{GS40}=V_{ref}-V_{SS} \qquad (4)$$

Since transistors 40 and 41 have the same sizing $$V_{GS40}=V_{GS41} \qquad (5)$$

Rewriting equation (3) using equations (4) and (5) to eliminate $V_{GS41}$ results in $$V_{in}>V_{ref}+V_{th} \qquad (6)$$

Equation (6) shows that the lowest acceptable value for the input voltages $V_1$ and $V_2$ for the comparator shown in FIG. 2 is $V_{ref}+V_{th}$. Therefore, as previously noted, the reference voltage $V_{ref}$ should be minimized to maximize the input dynamic range.

Figure 3:
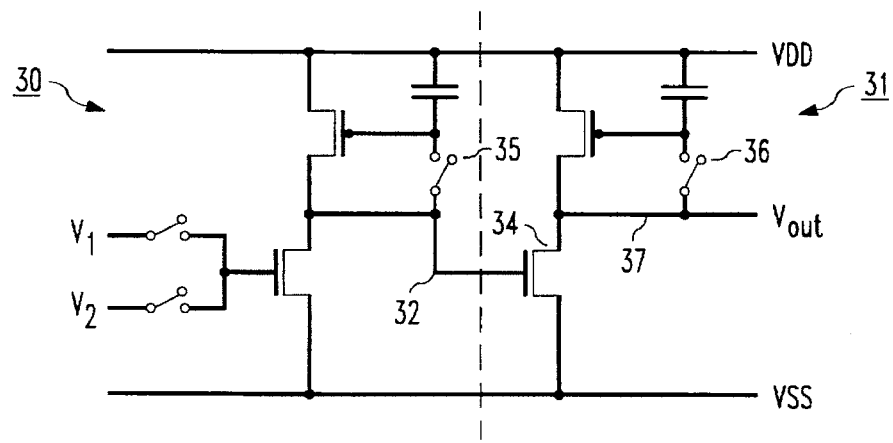
FIG. 3 shows another alternative embodiment of the invention in which a plurality of the voltage comparators shown in FIG. 1 are cascaded together to increase gain.

In practice of course, the comparator output is loaded and as a result the output voltage will not reach either $V_{DD}$ or $V_{SS}$ when the difference current representing the difference between $I_{ds}(V_2)$ and $I_{ds}(V_1)$ is small. Thus, in order to increase the gain and as a consequence the sensitivity of the comparator a cascaded structure such as shown in FIG. 3 may be used. While FIG. 3 shows a two-stage comparator in which two of the FIG. 1 comparators are cascaded together, one of ordinary skill in the art will recognize that in general an N-stage comparator may be used, where N is any desired number of individual comparators which are cascaded together. The comparators shown in FIG. 3 are cascaded together by coupling the output terminal 32 of the first comparator 30 to the gate of the first transistor 34 in the second comparator 31. The cascaded comparator operates in the same manner as the single stage comparator shown in FIG. 1 except that the switches 35 and 36 respectively connecting the gates of the second transistors in the first and second comparators 30 and 31 to the output terminals 32 and 37 must both be operated in synchronism. The gain of the N-stage comparator equals $A_1A_2A_3 \ldots A_N$, where $A_k$ is the voltage gain of stage k. The voltage gain $A_k$ of stage k is defined as the voltage change that appears at the output of stage k for a given voltage change appearing at the input of stage k (i.e., at the gate of the first transistor in stage k).

Figure 4:
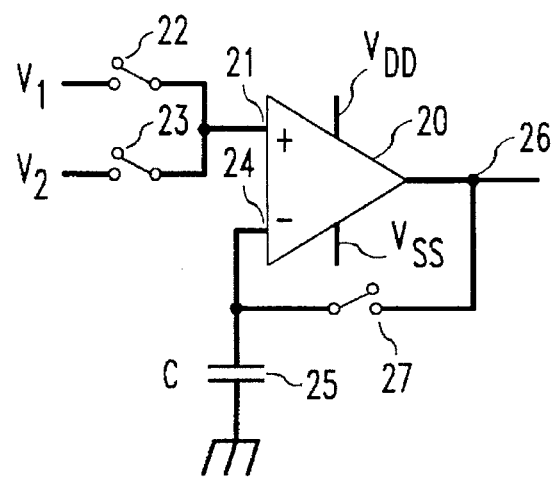
FIG. 4 shows yet another alterative embodiment of the invention which employs an operational amplifier.

FIG. 4 shows an alternative embodiment of the invention which employs an operational amplifier 20. Operational amplifiers are well known devices that provide high open loop gain, high input impedance and low output impedance. Additional details concerning the characteristics and structure of operational amplifiers are not a pan of this invention and hence will not be discussed further.

As seen in FIG. 4, the operational amplifier is coupled to supply voltages $V_{SS}$ and $V_{DD}$. In contrast to the previous embodiments of the invention, the output of the operational amplifier can swing between almost completely between $V_{SS}$ and $V_{DD}$. The input voltages $V_1$ and $V_2$ are selectively applied to the noninverting input terminal 21 of the operational amplifier 20 via switches 22 and 23, respectively. The inverting input terminal 24 of the operational amplifier 20 is connected to a capacitor 25. The capacitor 25 may be a charge storage device such as a conventional capacitor or a MOS transistor in which the capacitance arises between the gate and transistor substrate. The capacitor 25 is in turn connected to a constant voltage source, which as illustrated in FIG. 4, may be at ground potential. The inverting input terminal 24 of the operational amplifier 20 is also selectively connectable to the output 26 of the operational amplifier 20 via a switch 27. The output 26 of the operational amplifier 20 serves as the output of the voltage comparator.

The operation of the comparator shown in FIG. 4 is similar to that of the comparator shown in FIG. 1. That is, the comparator shown in FIG. 4 undergoes both a transfer period and a compare period during its operation. In the transfer period, switches 22 and 27 are both closed. As one of ordinary skill will recognize, the output voltage $V_{out}$ appearing at the output terminal 26 of an operational amplifier may be expressed as follows:

$$V_{out}=A(V_+-V_-+V_{off}) \qquad (7)$$

where A is an appropriate proportionality constant, $V_+$ is the voltage at the noninverting input, $V_-$ is the voltage at the inverting input, and $V_{off}$ is an offset voltage inherent in the operational amplifier due to the mismatch between the input transistors.

When switches 22 and 27 are closed so that $V_+=V_1$ and $V_-=V_{out}$, this equation reduces to:

$$V_-=[A/(A+1)](V_1+V_{off}) \qquad (8)$$

Since A is infinite for an ideal operational amplifier, this equation can be approximated as:

$$V_-=V_1+V_{off} \qquad (9)$$

As equation (9) indicates, when switches 22 and 27 are both closed the voltage at the inverting input terminal 24 equals the first input voltage $V_1$ offset by the voltage $V_{off}$. This voltage at the inverting input will appear across the capacitor 25. In the second pan of the transfer period switch 27 is opened so that the voltage $V_1+V_{off}$ is stored across the capacitor 25.

In the compare period of operation switch 22 is opened and switch 23 is closed so that the second input voltage $V_2$ appears at the noninverting input terminal $V_+$. Substituting into equation 7 the voltages presently appearing at the positive and negative input terminals yields:

$$V_{out}=A(V_2-(V_1+V_{off})+V_{off})=A(V_2-V_1) \qquad (10)$$

Figure 5:
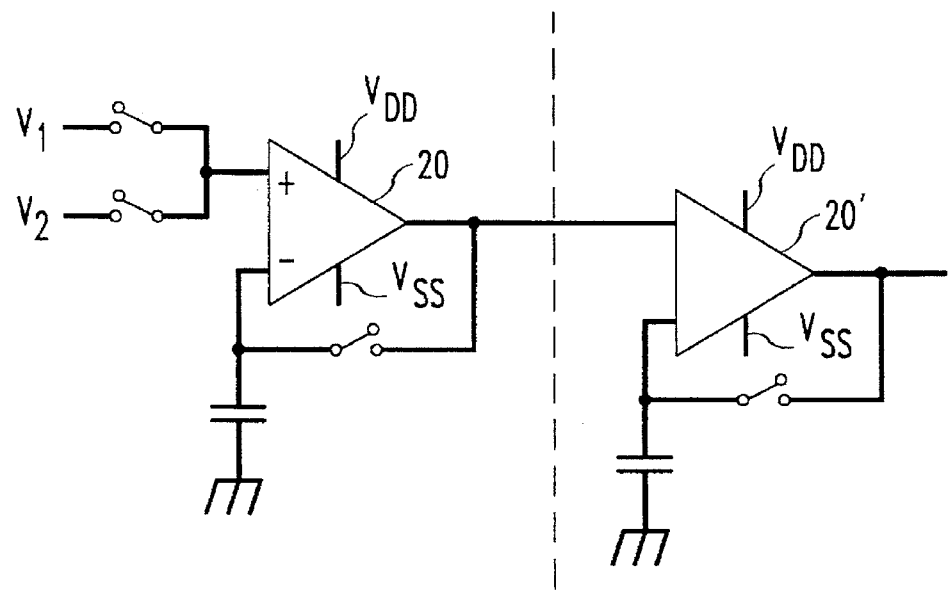
FIG. 5 shows still yet another alternative embodiment of the invention in which a plurality of the voltage comparators shown in FIG. 4 are cascaded together to increase gain.

Accordingly, the output voltage $V_{out}$ is independent of the offset voltage $V_{off}$ and the sign of the output voltage $V_{out}$ indicates the larger of the two input voltages. More particularly, as with the first embodiment of the invention, the output voltage $V_{out}$ will equal one of the supply voltages $V_{SS}$ or $V_{DD}$ supplied to the operational amplifier depending on whether $V_1$ or $V_2$ is the larger voltage. An N-stage comparator may be formed by cascading together two or more of the single stage comparators shown in FIG. 4 in the same manner shown in FIG. 3. That is, the output of each operational amplifier is coupled to the noninverting input of the succeeding operational amplifier as shown in FIG. 5.

The embodiments of the invention shown in FIGS. 1–3 may be fabricated from discrete MOS transistors. Alteratively, these embodiments may be fabricated as a monolithic device using a conventional digital Complementary Metal Oxide Semiconductor (CMOS) process. The embodiment of the invention shown in FIG. 4 employing an operational amplifier may be fabricated by any conventional process, including bipolar or CMOS processes, or a combination thereof.

We claim:

1. A method for comparing a first input voltage to a second input voltage, said method comprising the steps of:

transforming a first input voltage into a first current flowing through a first transistor and a second transistor;

transforming a second input voltage into a second current flowing through said first transistor while said first current continues flowing through said second transistor, wherein said first and second input voltages are transformed using a direct connection from the input voltages through a switch to the first transistor;

developing a difference current representing the difference between said first current and said second current; and generating an indicator signal indicating the larger of the first and second input voltages based on the value of the difference current.

2. The method of claim 1 wherein the step of transforming the first input voltage comprises the step of applying the first input voltage to a first switch directly connected to the gate of the first transistor.

3. The method of claim 2 further comprising the step of storing a voltage corresponding to the first current so that the first current continues flowing through the second transistor after the first input voltage has been removed from the gate of the first transistor.

4. The method of claim 3 further comprising the step of removing the first input voltage from the gate of the first transistor and wherein the step of transforming the second input voltage comprises the step of applying the second input voltage to a second switch directly connected to the gate of the first transistor.

5. The method of claim 4 wherein the voltage storing step comprises the step of arranging the second transistor in a diode mounted configuration while applying the first input voltage to the gate of the first transistor.

6. The method of claim 5 wherein the arranging step comprises the step of selectively connecting the gate of the second transistor to an output terminal on which the indicator signal is generated.

7. The method of claim 6 wherein the indicator signal comprises a voltage signal.

8. An apparatus for comparing a first input voltage to a second input voltage, comprising:

a first transistor of a first polarity having a drain-source path, a gate for selectively receiving the first and second input voltages, and a first source terminal for receiving a first supply voltage;

a switching element directly connected to the gate of the first transistor for selectively applying the first and second input voltages to the gate of the first transistor;

a second transistor of a polarity opposite to the first polarity, said second transistor having a drain-source path serially coupled to the drain-source path of the first transistor and a second source terminal for receiving a second supply voltage;

an output terminal coupled to the drains of the first and second transistors; and a switch for selectively coupling the gate of the second transistor to the output terminal.

9. The apparatus of claim 8 further comprising a charge storage device having a first terminal coupled to the gate of the second transistor and a second terminal for receiving the second supply voltage.

10. The apparatus of claim 9 wherein the charge storage device is selected from the group consisting of a capacitor and a transistor.

11. The apparatus of claim 8 further comprising a source follower having supply terminals for receiving the first and second supply voltages, a first input coupled to the switching element, a second input for receiving a reference voltage, and an output coupled to the gate of the first transistor.

12. The apparatus of claim 11 wherein the source follower comprises third and fourth transistors having serially connected source-drain paths.

13. The apparatus of claim 12 wherein said first and second inputs respectively comprise the gates of the third and fourth transmitters.

14. An apparatus for comparing a first input voltage to a second input voltage, comprising:

at least N comparator stages, $N \geq 2$, each of said comparator stages including;

a first transistor of a first polarity having a drain-source path, a gate for receiving an input voltage, and a first source terminal for receiving a first supply voltage;

a second transistor of a polarity opposite to the first polarity, said second transistor having a drain-source path serially coupled to the drain-source path of the first transistor and a second source terminal for receiving a second supply voltage;

an output terminal coupled to the drains of the first and second transistors;

a switch for selectively coupling the gate of the second transistor to the output terminal;

a switching element for selectively applying the first and second input voltages to the gate of the first transistor in a first of the at least N comparator stages;

wherein the N comparator stages are cascaded together so that, for all k, the output terminal of comparator stage k is coupled to the gate of the first transistor in comparator stage k+1, where $N-1 > k \geq 1$.

15. The apparatus of claim 14 wherein at least one of said N comparator stages further comprises a charge storage device having a first terminal coupled to the gate of the second transistor and a second terminal for receiving the second supply voltage.

16. The apparatus of claim 15 wherein the charge storage device is selected from the group consisting of a capacitor and a transistor.

17. The apparatus of claim 14 wherein at least one of said N comparator stages further comprises a source follower having supply terminals for receiving the first and second supply voltages, a first input coupled to the output terminal of an upstream comparator stage, a second input for receiving a reference voltage, and an output coupled to the gate of the first transistor in said at least one of said N comparator stages.

18. The apparatus of claim 17 wherein the source follower comprises third and fourth transistors having serially connected source-drain paths, said first and second inputs respectively including the gates of the third and fourth transistors.

19. An apparatus for comparing a first input voltage to a second input voltage, comprising:

an operational amplifier having an inverting input, a non-inverting input, and an output;

a switch directly connected to the noninverting input of the operational amplifier that selectively applies the first and second input voltages to the noninverting input of the operational amplifier, a charge storage device having a first terminal coupled to the inverting input of the operational amplifier and a second terminal for receiving a supply voltage; and a switch that selectively couples the output of the operational amplifier to the inverting input of the operational amplifier.

20. The apparatus of claim 19 wherein the charge storage device is selected from the group consisting of a capacitor and a transistor.

21. An apparatus for comparing a first input voltage to a second input voltage, comprising:

at least N comparator stages, N≧2, each of said comparator stages including:

an operational amplifier having an inverting input, a non-inverting input, and an output;

a capacitor having a first terminal coupled to the inverting input of the operational amplifier and a second terminal for receiving a supply voltage;

a switch for selectively coupling the output of the operational amplifier to the inverting input of the operational amplifier;

a switching element directly coupled to the noninverting input of the operational amplifier for selectively applying the first and second input voltages to the noninverting input of the operational amplifier in a first of the at least N comparator stages;

wherein the N comparator stages are cascaded together so that, for all k, the output of comparator stage k is directly connected to the noninverting input of the operational amplifier in comparator stage k+1, where N−1≧k≧1.

22. The apparatus of claim 21 wherein the capacitor in at least one of said comparator stages comprises a transistor.

23. An apparatus for comparing a first input voltage to a second input voltage, comprising:

means for storing the first input voltage offset by an offset voltage as a stored voltage;

means for developing a differential voltage between the second input voltage offset by the offset voltage and the stored voltage;

a switch directly connecting the first input voltage and the second input voltage to the storing means and the developing means, the switch selectively inputting the first and the second input voltage to the apparatus; and means, responsive to said developing means, for generating an output signal proportional to the differential voltage.

24. The apparatus of claim 23 wherein said generating means comprises an operational amplifier having an inverting input, a noninverting input, and an output.

25. The apparatus of claim 24 wherein said storing means comprises a switch for selectively coupling the output of the operational amplifier to the inverting input of the operational amplifier and a capacitor having a first terminal coupled to the inverting input of the operational amplifier and a second terminal for receiving a supply voltage.

26. A method for comparing a first input voltage to a second input voltage, said method comprising the steps of:

storing the first input voltage offset by an offset voltage as a stored voltage;

developing a differential voltage between the second input voltage offset by said offset voltage and the stored voltage;

selectively applying the first input voltage and the second input voltage using a direct connection from the input voltages through a switch to an input terminal of an operational amplifier; and generating an output signal proportional to the differential voltage, said output signal indicating the larger of the first and second input voltages.

27. The method of claim 26 wherein said offset voltage is generated by the operational amplifier.

28. The method of claim 27 wherein the differential voltage is developed across the inverting and noninverting inputs of the operational amplifier.

29. The method of claim 28 wherein the stored voltage is stored in a capacitor.

30. A method for comparing a first input voltage to a second input voltage, said method comprising the steps of:

selectively applying the first input voltage and the second input voltage using a switch for directly connecting the input voltages to an input of an operational amplifier;

storing the first input voltage offset by an offset voltage as a stored voltage;

offsetting the second input voltage by said offset voltage to form an offsetting second voltage; and generating an output signal representing a difference between the stored voltage and the offsetting second voltage, said output signal indicating a larger of the first and second input voltages.

31. The method of claim 1 wherein said indicator signal is based on the value of the difference current after said difference current traverses a plurality of N cascaded comparator stages, wherein the N comparator stages are cascaded together so that for all k, said indicator signal of comparator stage k is directly coupled to an input of comparator stage k+1, where N−1≧k≧1 each of said N plurality of cascaded comparator stages comparing the first input voltage to the second input voltage.

* * * * *